US007522468B2

(12) United States Patent
Norman

(10) Patent No.: US 7,522,468 B2
(45) Date of Patent: Apr. 21, 2009

(54) SERIAL MEMORY INTERFACE

(75) Inventor: Robert Norman, Blaine, WA (US)

(73) Assignee: Unity Semiconductor Corporation ( * ) Notice: Subject to any disclaimer, the term of this patent is extended or adjusted under 35 U.S.C. 154(b) by 451 days.

(21) Appl. No.: 11/449,105

(22) Filed: Jun. 8, 2006

(65) Prior Publication Data
US 2007/0286009 A1 Dec. 13, 2007

(51) Int. Cl.
G11C 8/00 (2006.01)
(52) U.S. Cl. .............. 365/230.05; 365/230.03; 365/63
(58) Field of Classification Search ............ 365/230.05, 365/230.03, 51, 63
See application file for complete search history.

(56) References Cited

U.S. PATENT DOCUMENTS

| 3,886,577 | A | 5/1975 | Buckley |
| 5,296,716 | A | 3/1994 | Ovshinsky et al. |
| 6,204,139 | B1 | 3/2001 | Liu et al. |
| 6,216,205 | B1 * | 4/2001 | Chin et al. ............ 711/131 |
| 6,473,332 | B1 | 10/2002 | Ignatiev et al. |
| 6,487,106 | B1 | 11/2002 | Kozicki |
| 6,531,371 | B2 | 3/2003 | Hsu et al. |
| 6,594,196 | B2 * | 7/2003 | Hsu et al. ............ 365/230.05 |
| 6,657,888 | B1 | 12/2003 | Doudin et al. |
| 6,731,528 | B2 | 5/2004 | Hush et al. |
| 6,753,561 | B1 | 6/2004 | Rinerson et al. |
| 6,807,088 | B2 | 10/2004 | Tsuchida |
| 6,825,489 | B2 | 11/2004 | Kozicki |
| 6,836,421 | B2 | 12/2004 | Rinerson et al. |
| 6,856,536 | B2 | 2/2005 | Rinerson et al. |
| 7,002,197 | B2 | 2/2006 | Perner et al. |
| 2003/0132456 | A1 | 7/2003 | Miyai et al. |
| 2004/0141369 | A1 | 7/2004 | Noguchi |
| 2005/0135148 | A1 | 6/2005 | Chevallier et al. |
| 2005/0151156 | A1 | 7/2005 | Wu et al. |
| 2006/0050598 | A1 | 3/2006 | Rinerson et al. |
| 2006/0164882 | A1 | 7/2006 | Norman |
| 2006/0171200 | A1 | 8/2006 | Rinerson et al. |

OTHER PUBLICATIONS

U.S. Appl. No. 60/536,115, filed Jan. 13, 2004, Wu et al.
A.Baikalov, et al, "Field -driven hysteretic and reversible resistive switch at the Ag-Pr0.7Ca0.3MnO3 interface" Applied Physics Letters, vol. 83, No. 5, Aug. 4, 2003, pp. 957-959.
A. Beck, J. Bednorz, A. Bietsch, Ch. Gerber, C. Rossel, D. Widmer, "Reproducible switching effect in thin oxide films for memory applications," Applied Physics Letters, vol. 77, No. 1, Jul. 3, 2000, pp. 139-141.
A. Sawa, et al, "Hysteretic current-volyage characteristics and resistance switching at a rectifying Ti/$Pr_{0.7}Ca_{0.3}MnO_3$ interface" Applied Physics Letters, vol. 85, No. 18, Nov. 1, 2004, pp. 4073-4075.
C. Rossel, G.I. Meijer, D. Brémaud, D. Widmer, "Electrical current distribution across a metal-insulator-metal structure during bistable switching," Journal of Applied Physics, vol. 90, No. 6, Sep. 15, 2001, pp. 2892-2898.

(Continued)

Primary Examiner—Anh Phung
Assistant Examiner—Toan Le

(57) ABSTRACT

A serial memory interface is described, including a memory array, a plurality of serial ports in data communication with the memory array, transferring data between the memory array and at least one of the plurality of serial ports, and a logic block that is configured to control access to the memory array by the plurality of serial ports, the logic block using the serial ports to transfer data between the memory array and at least one of the plurality of serial ports.

26 Claims, 12 Drawing Sheets

OTHER PUBLICATIONS

David Oxley, "Memory Effects in Oxide Films" in Oxides and Oxide Films, vol. 6, pp. 251-325 (Chapter 4) (Ashok. K. Vijh ed., Marcel Drekker) (1981).

J.G. Simmons and R.R. Verderber, "New Conduction and Reversible Memory Phenomena in Thin Insulating Films," Proc. Roy. Soc. A., 301 (1967), pp. 77-102.

Liu et al., "A New Concept for Non-Volatile Memory: The Electric-Pulse Induced Resistive Change Effect in Colossal Magnetoresistive Thin Films," Non-Volatile Memory Technology Symposium, Nov. 7, 2001, pp. 1-7.

Liu et al., "Electric-pulse-induced reversible resistance change effect in magnetoresistive films," Applied Physics Letters, vol. 76, No. 19, May 8, 2000, pp. 2749-2751.

R.E. Thurstans and D.P. Oxley, "The Electroformed metal-insulator-metal structure: A comprehensive model," J. Phys. D.: Appl. Phys. 35 (2002), Apr. 2, 2002, pp. 802-809.

Y. Watanabe, J.G. Bednorz, A. Bietsch, Ch. Gerber, D. Widmer, A. Beck, "Current-driven insulator-conductor transistion and nonvolatile memory in chromium-doped SrTiO3 single crystals," Applied Physics Letters, vol. 78, No. 23, Jun. 4, 2001, pp. 3738-3740.

R. Oligschlaeger, R. Waser, R. Meyer, S. Karthäuser, R. Dittmann, "Resistive switching and data reliability of epitaxial (Ba,Sr)TiO thin films," Applied Physics Letters, 88 (2006), 042901.

S. Lai, T. Lowrey, "OUM—A 180 nm nonvolatile memory cell element technology for standalone and embedded applications," IEEE International Electron Device Meeting, Technical Digest, 803 (2001).

J. Mizusaki J, Y. Yonemura, H. Kamata, K. Ohyama, N. Mori, H. Takai, H. Tagawa, M. Dokiya, K. Naraya, T. Sasamoto, H. Inaba, T. Hashimoto, "Electronic conductivity, Seebeck coefficient, defect and electronic structure of nonstoichiometric $La_{1-x}Sr_xMnO_3$," Solid State Ionics 132, 167 (2000).

Zhao Y. G. ; Rajeswari M. ; Srivastava R. C. ; Biswas A. ; Ogale S. B. ; Kang D. J. ; Prellier W. ; Zhiyun Chen ; Greene R. L. ; Venkatesan T., "Effect of oxygen content on the structural, transport, and magnetic properties of $La_{1-delta}Mn_{1-delta}O_3$ thin films," Journal of Applied Physics, vol. 86, No. 11, Dec. 1999, pp. 6327-6330.

J. R. Stetter, W. R. Penrose, S. Yao, "Sensors, Chemical Sensors, Electrochemical Sensors, and ECS," Journal of The Electrochemical Society, 150 (2), S11-S16 (2003).

B. C. H. Steele, A. Heinzel, "Materials for Fuel-Cell Technologies," Nature 414, Nov. 2001, pp. 345-352.

A. Reller, J. M. Thomas, D. A. Jefferson, M. K. Uppal, "Superstructures Formed by the Ordering of Vacancies in a Selective Oxidation Catalyst: Grossly Defective $CaMnO_3$," Proceedings of the Royal Society of London, vol. 394, No. 1807 Aug. 1984, pp. 223-241.

A. J. Millis, "Cooperative Jahn-Teller effect and electron-phonon coupling in $La_{1-x}A_xMnO_3$," Phys. Rev. B 53, 8434-8441 (1996).

\* cited by examiner

| IDLE | END | CRC/ECC | Data | Address | Address Marker | Start |
|------|-----|---------|------|---------|----------------|-------|
| 1502 | 1504 | 1506 | 1508 | 1510 | 1512 | 1514 |

| IDLE | END | CRC/ECC | Data | Start |
|------|-----|---------|------|-------|
| 1602 | 1604 | 1606 | 1608 | 1610 |

| IDLE | END | CRC/ECC | Data | Address | Address Marker | Special Marker | Start |
|------|-----|---------|------|---------|----------------|----------------|-------|
| 1702 | 1704 | 1706 | 1708 | 1710 | 1712 | 1714 | 1716 |

SERIAL MEMORY INTERFACE

FIELD OF THE INVENTION

The present invention relates generally to semiconductors. More specifically, a serial memory interface is described.

BACKGROUND OF THE INVENTION

Memory systems include memory interfaces that enable data to be read and written from a memory array. Conventional memory systems store binary data in individual memory cells of a memory array, reading and writing data bits (i.e., binary "0"s and "1"s) to memory cells using driving voltages (e.g., read voltage, write voltage, driving voltage, and the like). Interfaces enable other devices to access and use data stored in memory cells.

FIG. 1 illustrates a conventional memory system. Conventional memory system 100 includes memory bank 102. To access individual memory cells within memory bank 102, column logic 104 and row logic 106 are directed by control logic 108 when accessing a particular memory cell. Data stored in memory system 100 is accessed by other devices using a parallel interface.

Conventional interfaces convert data from parallel to serial formats for transmission and then back to a parallel format upon receipt, which incurs significant time delays and reduces capacity. In some cases, conventional interfaces perform multiple conversions, which require large chip layouts and design during fabrication, including large numbers of pins or packaging (interfacing circuitry with other devices or systems). Conventional parallel interfaces are used with various memory architectures, including static random access memory (SRAM) and dynamic random access memory (DRAM). Conventional interfaces with SRAM architectures typically have control lines that cause various functions to be performed when active. Control lines, along with address lines and data lines, contribute to large chip architectures. A chip select control line is used to select an address within a memory device and also allows for multiple chips to be tied together in a memory system. A read select control line is used to read data from a memory device. In contrast, a write select control line is used to write data to a memory device. When a chip select control line is combined with a read select control line, data is read from a memory cell and driven to the output of the memory device. When chip select and write select control lines are active, data is written to a memory cell indicated by address lines that refer to a particular row and column address for the memory device.

Data lines may either be dedicated input and output lines, such as those shown in FIG. 2, or combined into a single set of data lines, as in the example shown in FIG. 3. Conventional SRAM interfaces require large numbers of pins in order to support large memory capacities, which results in large, expensive packages. As packaging sizes increases, inductance and capacitance also increase, reducing access speeds. Conventional DRAM interfaces also have performance limitations.

FIG. 4 illustrates a conventional DRAM interface 400, which multiplexes data to share input/output ports to reduce the number of connections (i.e., pins). For example, conventional DRAM interfaces multiplex address and payload data to share input/output ports. In some examples, payload data may refer to data included in the body (i.e., not in the header or trailing bits of data) of a packet, frame, segment, or other type of data encapsulation. However, this is time consuming, increases power consumption, and increases access times and decreases throughput. Further, DRAM memory devices transfer large amounts of data, requiring large numbers of pins and packaging.

FIG. 5 illustrates a conventional memory system using a DRAM interface. Conventional memory system 500 includes a disk controller 502 which interfaces with memory devices 504. Memory devices 504 can be implemented as a single or multiple memory devices. As part of the disk controller 502, processor 506, DRAM controller 508, physical (PHY)/link (media access control or MAC) layer logic block 510, error checking and correction (ECC) 512, and disk port interface 514 for ports P0-P3 are included. Data is read and written by disk controller 502 over DRAM controller 508 to memory devices 504. However, conventional system 500 is inefficient in that the single link between DRAM controller 508 and memory devices 504 often becomes a performance bottleneck, limiting the amount of memory system 500 throughput.

Ports P0-P3 bid for access to data in memory devices 504 simultaneously. Disk controller 502 may receive several bids to read or write data from memory devices 504. To handle the bids, disk controller 502 uses DRAM controller 508 to prioritize bids from external devices and perform handshakes to establish a path to memory devices 504. Bids transiting disk controller 502 create bottlenecks in the data flow. To alleviate the bottleneck, a very complex memory controller design is typically required. Design complexity results in substantial costs due to increased gate count. Further, high signaling speeds and large numbers of registers in complex memory system design also increase power consumption.

Continuing efforts are being made to improve memory interfaces.

BRIEF DESCRIPTION OF THE DRAWINGS

The invention may best be understood by reference to the following description taken in conjunction with the accompanying drawings, in which:

FIG. 15 illustrates an exemplary packet structure used with a serial memory interface;

FIG. 16 illustrates an exemplary data packet used with a serial memory interface after a command initial data packet are sent; and FIG. 17 illustrates an exemplary data packet structure used to implement a special internal write of a register.

Figure 1:
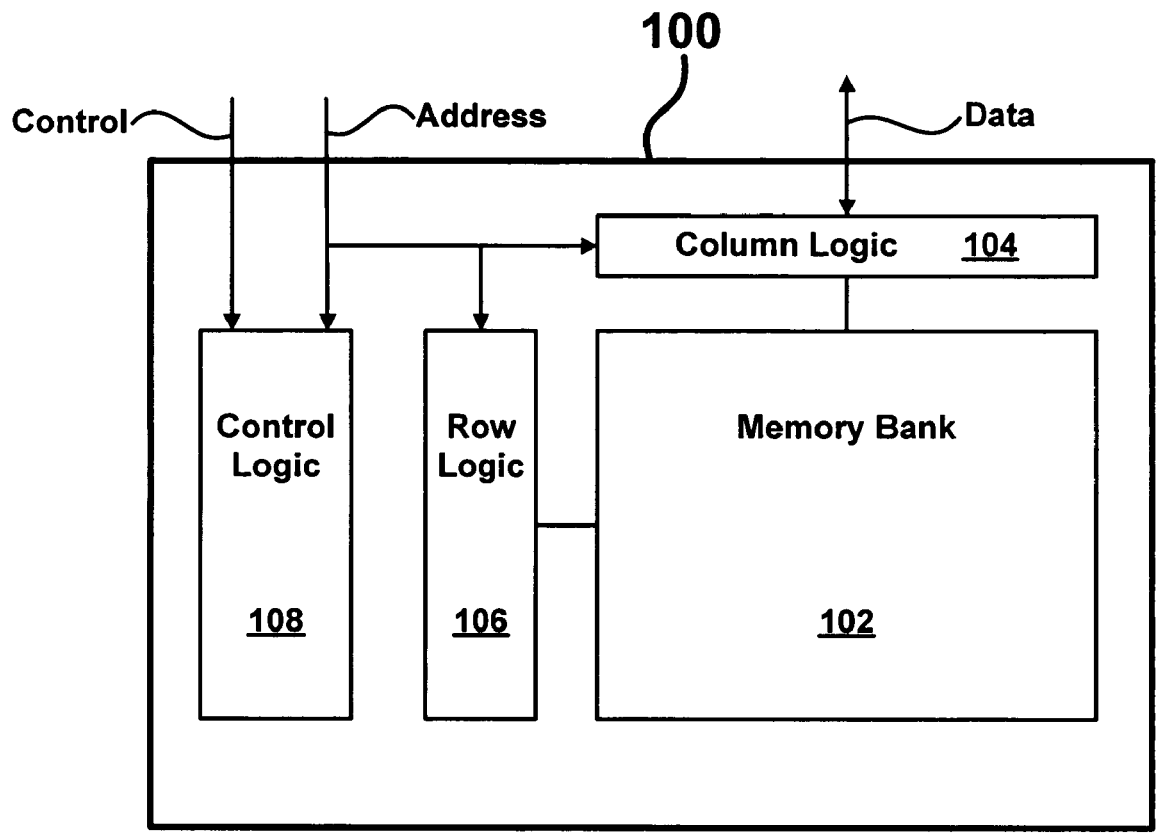
FIG. 1 illustrates a conventional memory system.
Figure 2:
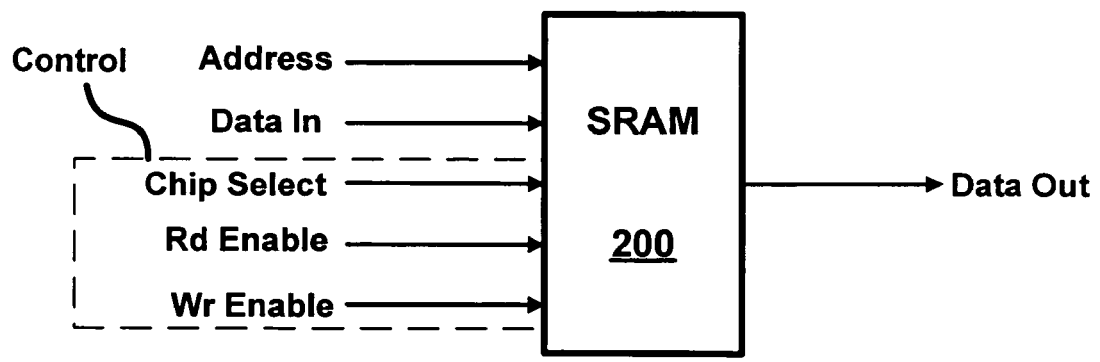
FIG. 2 illustrates a conventional SRAM interface with separate read and write data lines.
Figure 3:
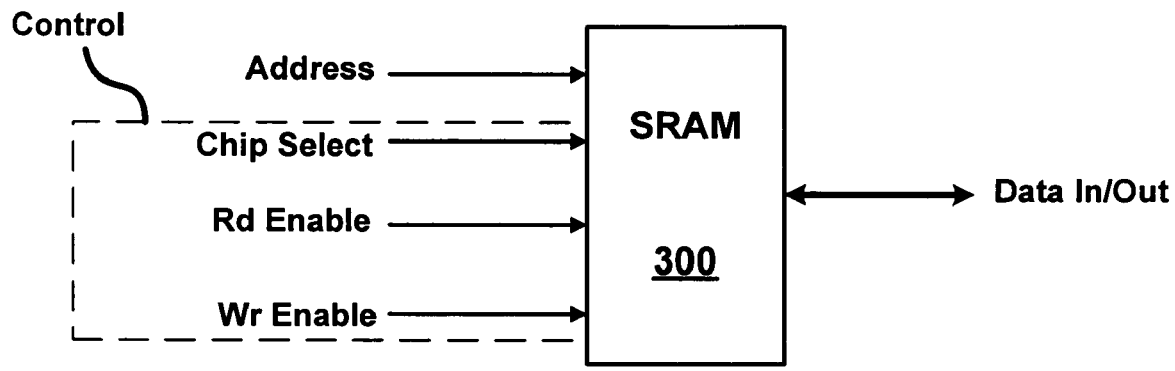
FIG. 3 illustrates a conventional SRAM interface with shared read and write data lines.
Figure 4:
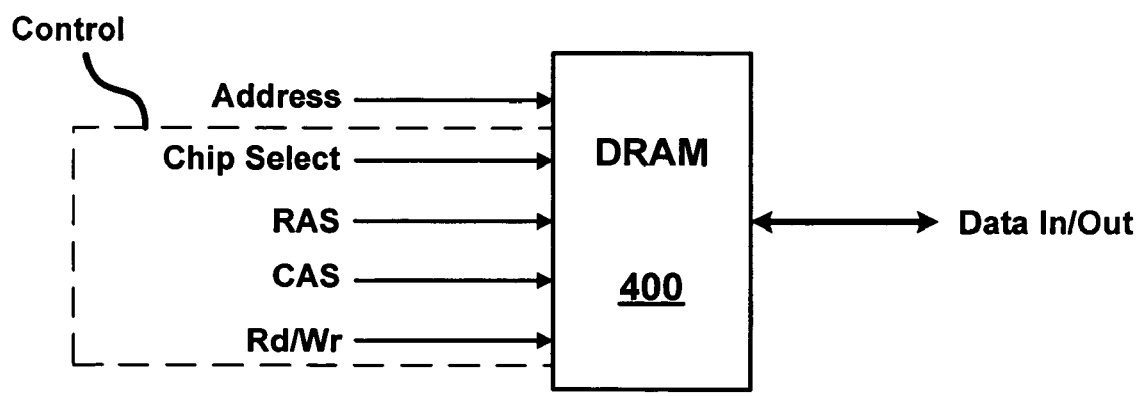
FIG. 4 illustrates a conventional DRAM interface.
Figure 5:
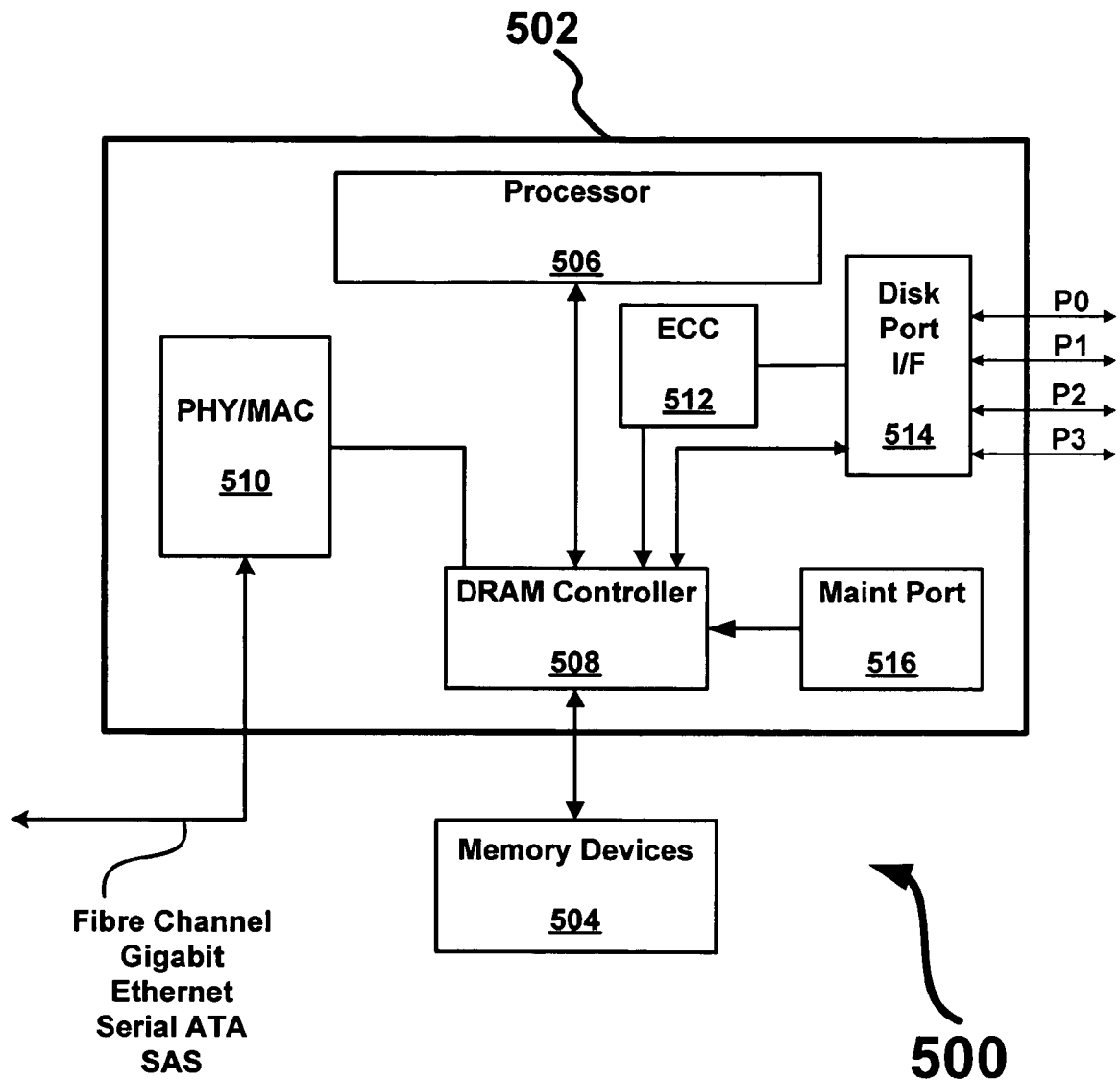
FIG. 5 illustrates a conventional memory system using a DRAM interface.

It is to be understood that, in the drawings, like reference numerals designate like structural elements. Also, it is understood that the depictions in the FIGS. are not necessarily to scale. Although various examples of the invention are disclosed in the accompanying drawings, the invention is not limited to those specific examples.

DETAILED DESCRIPTION OF THE PREFERRED EMBODIMENTS

The invention can be implemented in numerous ways, including as a system, a process, an apparatus, or a computer readable medium such as a computer readable storage medium or a computer network wherein program instructions are sent over optical or electronic communication links. In general, the steps of disclosed processes may be performed in an arbitrary order, unless otherwise provided in the claims.

A detailed description of one or more embodiments is provided below along with accompanying figures. The detailed description is provided in connection with such embodiments, but is not limited to any particular example. The scope is limited only by the claims and numerous alternatives, modifications, and equivalents that are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

Figure 6:
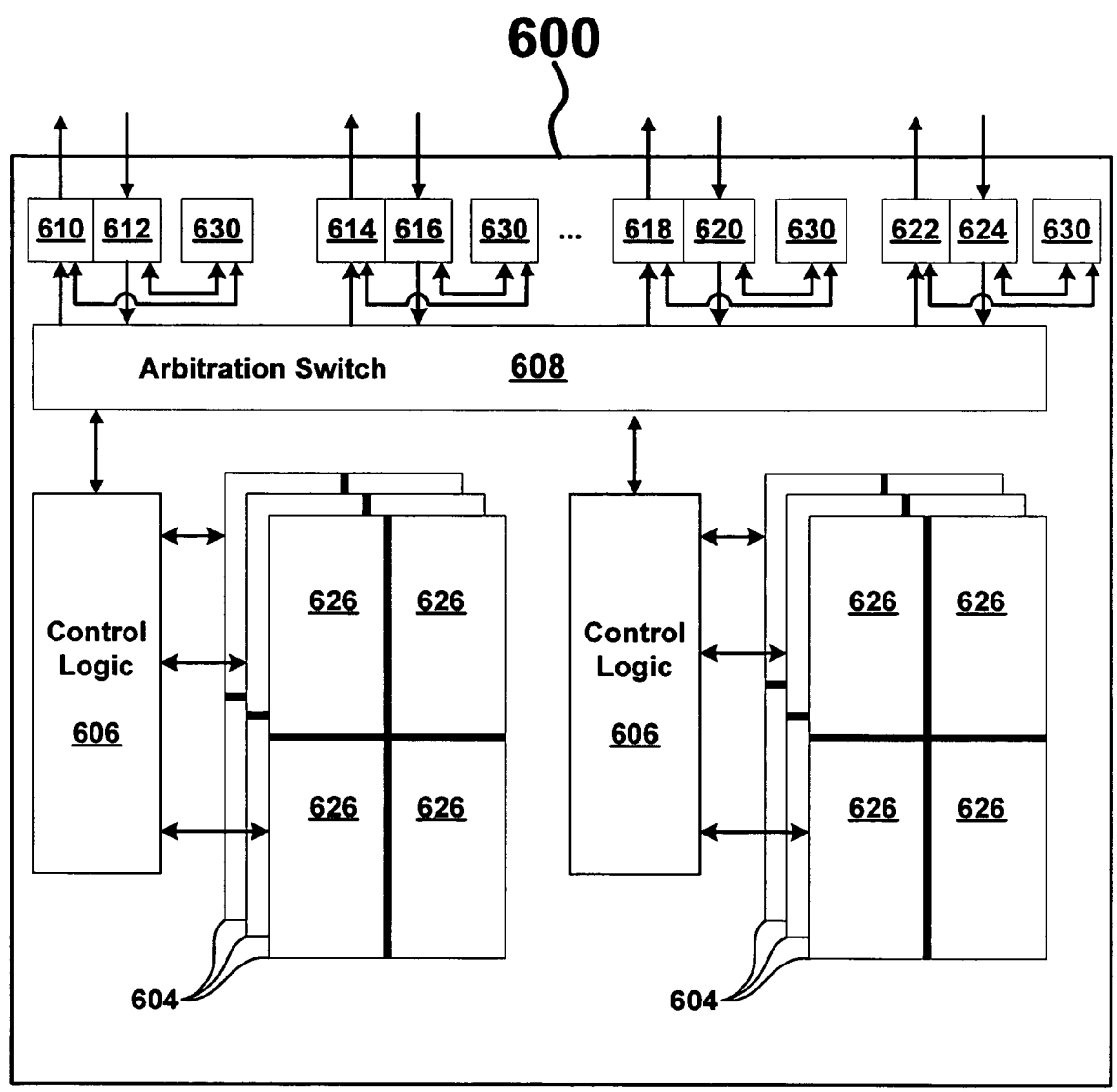
FIG. 6 illustrates an exemplary memory system having a serial memory interface.

FIG. 6 illustrates an exemplary memory system 600 having a serial memory interface. Here, memory system 600 includes memory planes 604, control logic 606, arbitration switch block or module (hereafter "block") 608, serial output ports 610, 614, 618, 622 and serial input ports 612, 616, 620, and 624, memory sub-planes 626, and port control logic 630. Serial memory interface ("serial interface") may refer to functionality and structure implemented using control logic 606, arbitration switch block 608, serial ports 610-624 to send and receive data bits ("bits") in serial, and/or data communication logic between memory system 600 and a host (not shown). Serial ports 610-624 allow data to be read and written to memory planes 604, which in certain embodiments may be further divided into memory sub-planes 626. As an example, different types of ports may be used to implement serial ports 610-624, such as cascaded serial ports, separate serial ports, and incoming serial ports. In some embodiments, memory planes 604 may be implemented using various types of memory technologies that enable different physical and logical arrangements (e.g., vertical stacking).

U.S. patent application Ser. No. 11/095,026, filed Mar. 30, 2005, and titled "Memory Using Mixed Valence Conductive Oxides," hereby incorporated by reference in its entirety and for all purposes, describes two terminal memory cells that can be arranged in a cross point array. The application describes a two terminal memory element that changes conductivity when exposed to an appropriate voltage drop across the two terminals. The memory element includes an electrolytic tunnel barrier and a mixed valence conductive oxide. The voltage drop across the electrolytic tunnel barrier causes an electrical field within the mixed valence conductive oxide that is strong enough to move oxygen ions out of the mixed valence conductive oxides and into the electrolytic tunnel barrier. Oxygen depletion causes the mixed valence conductive oxide to change its valence, which causes a change in conductivity. Both the electrolytic tunnel barrier and the mixed valence conductive oxide do not need to operate in a silicon substrate, and, therefore, can be fabricated above circuitry being used for other purposes (such as selection circuitry).

The two-terminal memory elements can be arranged in a cross point array such that one terminal is electrically coupled with an x-direction line and the other terminal is electrically coupled with a y-direction line. A stacked cross point array consists of multiple cross point arrays vertically stacked upon one another, sometimes sharing x-direction and y-direction lines between layers, and sometimes having isolated lines. When a first write voltage $V_{W1}$ is applied across the memory element, (typically by applying $\frac{1}{2} V_{W1}$ to the x-direction line and $\frac{1}{2}$-$V_{W1}$ to the y-direction line) it switches to a low resistive state. When a second write voltage $V_{W2}$ is applied across the memory element, (typically by applying $\frac{1}{2} V_{W2}$ to the x-direction line and $\frac{1}{2}$-$V_{W2}$ to the y-direction line) it switches to a high resistive state. Typically, memory elements using electrolytic tunnel barriers and mixed valence conductive oxides require $V_{W1}$ to be opposite in polarity from $V_{W2}$.

Here, serial ports 610-624 request, arbitrate, and are granted priority and are switched by logic block 608 to the data with memory planes 604. Each bit line of memory planes 604 can have associated drivers and sense amplifiers. In some embodiments, the associated drivers and sense amplifiers are internal to arbitration switch block 608 and interface with memory planes 604. In other embodiments, serial input ports 612, 616, 620, and 624 communicate independently with each host or control port external to the memory system 600. Serial input ports 610 to 624 include control logic 630 that implements an interface protocol independently of other channels communicating with memory system 600. Input and output control data are sent from port control logic 630 to serial input ports 610-624. Serial output ports 610, 614, 618, and 622 and serial input ports 612, 616, 620, and 624 evaluate incoming data packets, including control characters and subsequently generate control requests as inputs to arbitration switch block 608.

In other embodiments, serial input ports 612, 616, 620, and 624 may collectively act as a single data communication channel ("channel") having multiple high speed ports tied together to receive data in parallel at the same time. Serial input ports 612, 616, 620, and 624 allow for very fast access by allowing a host to use multiple paths when sending data to memory (e.g., memory planes 604 or memory sub-planes 626). Likewise, blocks 610, 614, 618 and 622 may act collectively to deliver data to a host from memory in a multiple serial manner. This also allows for a single channel to operate very fast by having multiple serial ports acting in concert to send data.

In some embodiments, a serial port methodology such as that described herein, allows for memory system designs with multiple ports acting independently and in data communication with different host ports. Further, multiple serial ports may be grouped to work together for sending or receiving data. For example, a host port may include 2, 4, or 8 pairs of serial ports working together as a single channel. Still further, a design may be implemented to support multiple channels comprising multiple ports. For example, a memory may have 4 channels with each channel consisting of 2 serial ports each. In other embodiments, serial ports and data communication protocols and methodologies such as those described above may be implemented differently and are not limited to the examples described.

Here, as each port receives incoming serial data, control characters (e.g., primitives) are removed and data is deserialized to a parallel format. In some embodiments, the data is serialized and deserialized by port control logic 630. The parallel data is then switched and presented to the memory array (e.g., memory sub-planes 606) in parallel. In other embodiments, serial data is passed with the control characters removed through the switch logic (e.g., arbitration switch block 608) and converted to parallel format within the memory array (e.g., memory sub-planes 626). Likewise read data may be converted in the memory array and sent in serial format to port control logic 630 where control characters are added before being sent to a host.

In some embodiments, a serial memory, based on the above description, is a memory that supports one or more data transmissions in each direction (i.e., in, out). A serial memory may have multiple channels, each of which may have one (1) or more serial ports (e.g., serial ports 610-624).

An exemplary arbitration switch block 608 may be implemented as logic that evaluates port requests within a clock cycle and grants path selections to the "winning" bid port selected as a result of arbitration. Usage criteria including priority, access control, and other control parameters may be used to determine what bids "win" and when other bids may be selected to allow data to be read from or written to memory system 600 using a serial interface such as that described herein. In some embodiments, ports may be granted access and given an access path through arbitration switch block 608 allowing access to memory planes 604 and/or memory sub-planes 626. Each of serial output ports 610, 614, 618, 622 and serial input ports 612, 616, 620, and 624 may be given simultaneous access to different memory partitions, allowing for multiple port access to memory system 600. In some embodiments, memory partitions may be isolated allowing for simultaneous access. Partitioning the memory array into planes, sub-planes or some other partitioning scheme (e.g., uneven partitions, a single partition consisting of multiple planes, a single partition consisting of vertical groups of sub-planes that span several planes) can optimize system usage in certain embodiments.

Simultaneous access enhances throughput of memory system 600 by moving more data over any given time. If conflicts occur during simultaneous access, then arbitration switch block 608 selects which port is granted access. Further, arbitration switch block 608 allows the port with the "winning" bid to connect to the appropriate memory partition. Arbitration switch block 608 sends a signal to the port indicating access has been granted to read or write data. The port that is not chosen by arbitration switch block 608 receives a signal indicating a "hold" from arbitration switch block 608. The signal indicating a "hold" may cause port interface logic within serial output ports 610, 614, 618, 622 and serial input ports 612, 616, 620, and 624 to pass a "hold" signal to a connected interface block of an external device that is requesting to read or write data to memory system 600. The "hold" signal delays the transfer of data to or from the port until access has been granted by arbitration switch block 608. Access may be granted when the port that previously had the "winning" bid has completed its access and releases its access request to memory partition. When the request is released the arbiter grants the port on "hold" access to memory partition.

Memory system 600 provides a serial memory interface that may be used with analog designs such as Fibre Channel, Serial Advanced Technology Attachment (SATA), serial small computer system interface (SCSI), single attachment station (SAS), Gigabit Ethernet, and others. Due to high data transfer and signaling speeds and the bit error rate expected, encoders may be used to balance DC voltages and detect bit failures. Encoders also generate control characters in addition to the data values being read or written. The control characters generate control functions for passing data to and from memory partitions. By using a serial memory interface, the number of pins in packages may be reduced, decreasing fabrication costs and power consumption (i.e., reducing the driving currents of input/output (IO) pins). Further, control lines in serial memory interfaces enable operations at Giga Hertz (GHz) or higher frequencies. In some embodiments, multiple control lines may be combined to share read and write access to memory system 600. In other embodiments, the address and data control lines to memory system 600 may be implemented differently.

Figure 7:
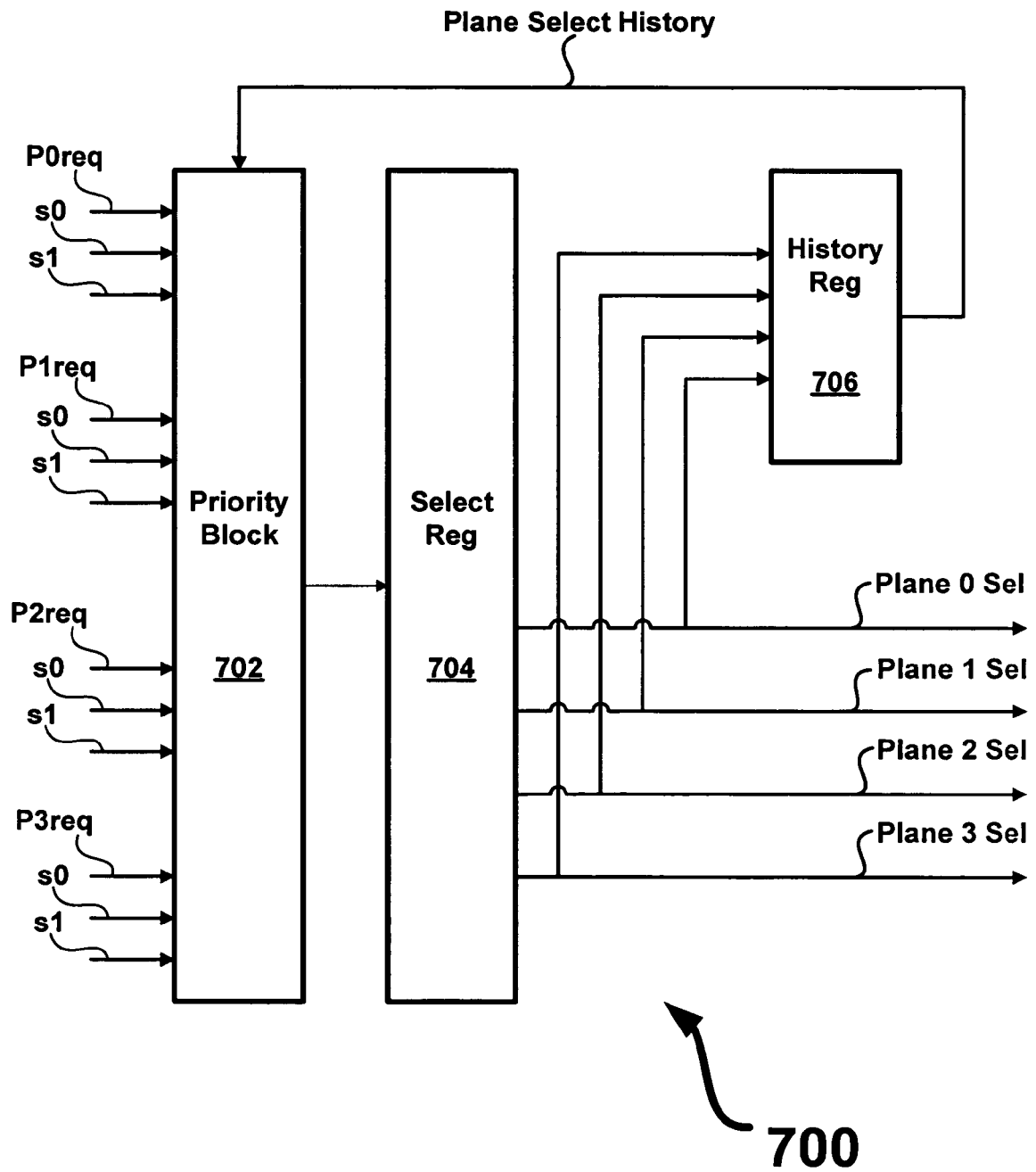
FIG. 7 illustrates an exemplary arbitration switch block of a serial memory interface.

FIG. 7 illustrates an example of another exemplary arbitration switch block 700 of a serial memory interface. Here, arbitration switch logic block 700 includes priority block 702, select register 704, and history register 706. Arbitration switch block 700 determines which ports are granted access based on evaluating incoming bids for extracting or inserting data into a memory array. In some embodiments, the determination of whether to grant access to a bidding port is made based on arbitration switch logic block 700 performing a priority select function, which includes the various techniques described below. Logic within arbitration switch logic block 700 may be implemented differently. For example, logic in arbitration switch logic block 700 may grant access to bids based on a "round robin," weighted priority (e.g., giving assigning priority values to bids coming from one port over another), or some other approach.

Here, arbitration switch logic block 700 includes priority block 702, which synchronizes inputs from ports based on factors including, but not limited to, timing skews and clock speeds. Priority block 702 also decodes input signals (e.g., "P0req," "s0," "s1," "P1req," "s0," "s1," "P2req," "s0," "s1," "P3req," "s0," "s1,") to determine which path to a particular port is requested for selection. The output of priority block 702 is registered in select register 704. Select register 704 outputs a driving signal (e.g., "Plane 0 Sel," "Plane 1 Sel," "Plane 2 Sel," "Plane 3 Sel") used by arbitration switch logic block 700 to select the requested path. Output from select register 704 is also input to history register 706, which stores a history of which paths were selected by a particular bid. History register 706 may be loaded when select register 704 is cleared. History register 706 stores the value of the previous path selection, which are input to priority block 702 and used to decode signals in the next clock cycle and determine priorities for the next set of incoming requests. The outputs from the select register 704 may also select sub-blocks within a plane. In other embodiments, the various components, systems, and processes described above may be varied.

Figure 8:
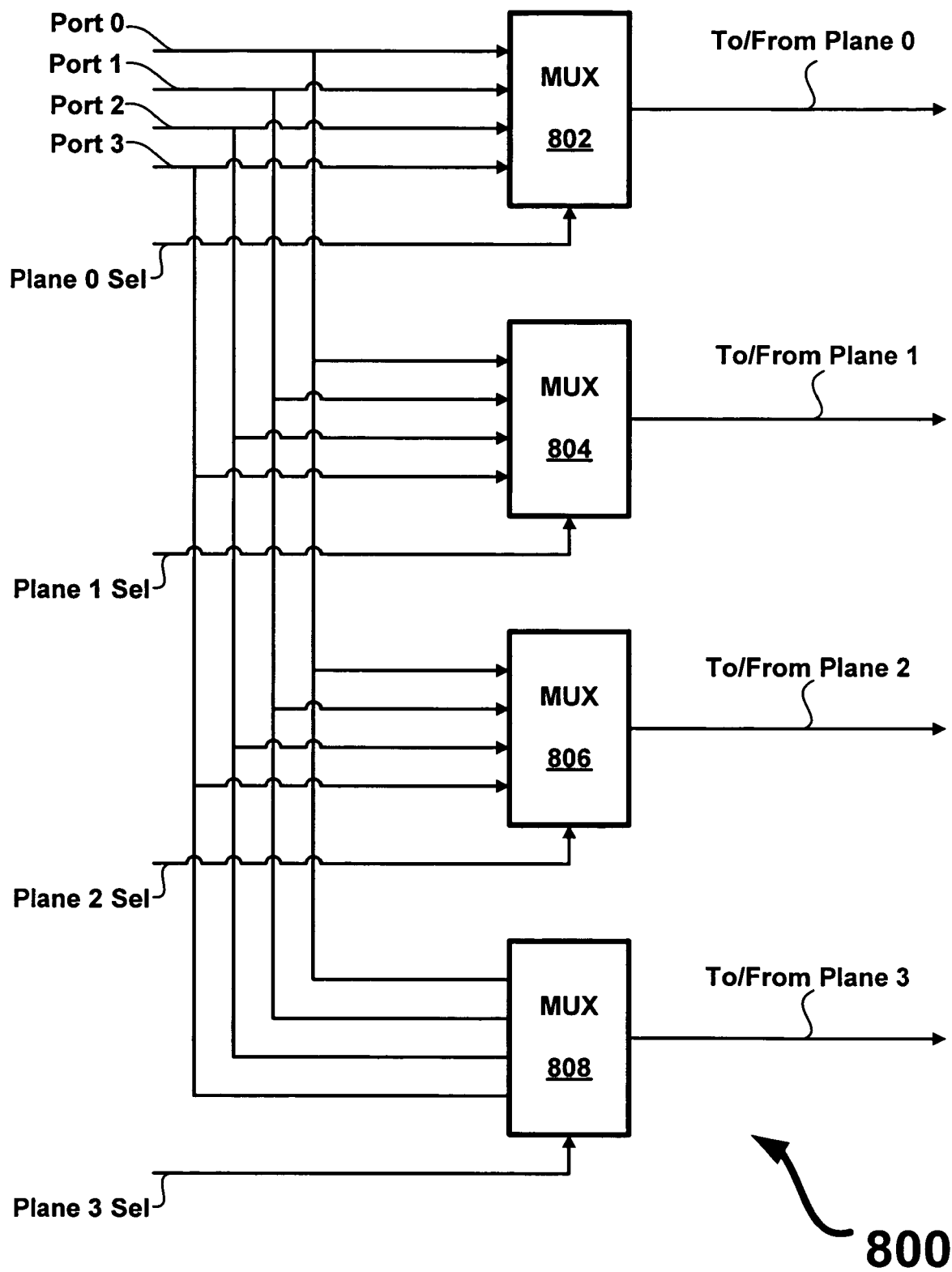
FIG. 8 illustrates an exemplary switch logic circuit for a serial memory interface.

FIG. 8 illustrates an exemplary switch logic circuit 800 for a serial memory interface. In some embodiments, switch logic circuit 800 includes multiplexers 802-808, which multiplex input request signals (e.g., "Port 0," "Port 1," "Port 2," "Port 3," "Plane 0 Sel," "Plane 1 Sel," "Plane 2 Sel," "Plane 3 Sel") in order to select the appropriate memory plane (e.g., "Plane 0," "Plane 1" "Plane 2" "Plane 3"). Switch logic circuit 800 may be implemented as a multiplexing network that allows each port connected to an independent memory partition (e.g., memory planes 604 and/or memory sub-planes 626 of FIG. 6) to be independently selected. In this embodiment, 4 ports are arbitrated to 4 memory planes. In other embodiments, it should be appreciated that the number of ports, port signals (i.e., busses), and memory planes and usage of memory sub-planes may be varied in other circuit designs. In some embodiments, port signals that act as busses may be bi-directional and gated accordingly. Switch logic circuit 800 may be implemented using logic or transmission gates to accommodate varying design approaches and speed requirements. Here, a memory plane is in its lowest power state when it is unselected (i.e., a requesting port has released the memory plane at the conclusion of a read or write operation). Additionally, an interface to the memory plane is gated to an inactive state, which is signaled to the memory plane inputs to allow the memory plane to be requested and selected again.

When the memory array is arranged as a cross point array, the switch logic circuit 800 physically accesses a memory partition through x-direction and y-direction array lines. For example, if the memory array uses two-terminal memory elements that include an electrolytic tunnel barrier and a mixed valence conductive oxide, both the x-direction and y-direction array lines may need to carry both positive and negative voltages since $V_{W1}$ is typically opposite in polarity to $V_{W2}$.

Figure 9:
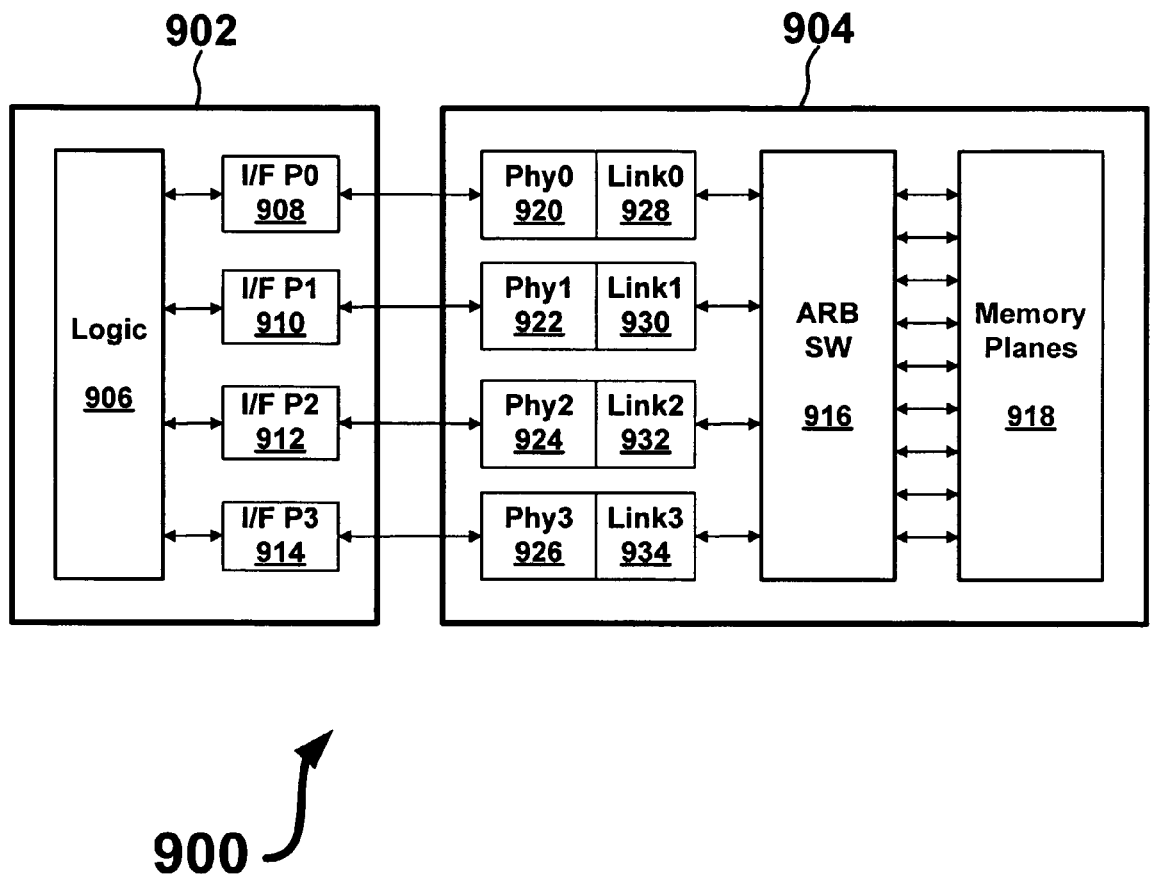
FIG. 9 illustrates an exemplary serial memory interface.

FIG. 9 illustrates an exemplary serial memory interface 900. In some embodiments, serial memory interface 900 includes controller 902 and memory 904. Controller 902 may be configured to include logic block 906 and ports 908-914. Memory 904 may include arbitration switch block 916 that communicate data from memory planes 918, physical (PHY) layer blocks 920-926, and link layer blocks 928-934. When a particular memory plane and a bus between the selected memory plane and one of ports 908, 910, 912, or 914 is selected, data packets may be streamed to read or write data to the selected memory plane. This process is determined by controller 902. To establish a path between memory planes 918 and ports 908-914, handshaking is performed by controller 902, which may be varied based on the design of serial memory interface 900. In some embodiments, handshaking is used to interface a port interface protocol with a memory protocol, ensuring that data may be communicated between controller 902 and memory 904. In the above example, it should be noted that the planes can be further divided into sub-planes for further granularity of partitioning. The select logic would be designed to select sub-planes within planes.

In FIG. 9, four (4) serial ports 908, 910, 912, and 914 are included with serial memory interface 900. In other embodiments, a different number of serial ports may be used. Here, each of ports 908-914 may be assigned one of PHY blocks 920-926 and one of link layer blocks 928-934. PHY blocks 920-926 provide analog, high speed signaling to "hand-off" (i.e., pass) control from PHY blocks 920-926 to link layer blocks 928-934, which provide logic control of requests and data transfer from memory planes 918 based on a serial stream of control characters and data characters, which are described in greater detail below in connection with FIG. 10. The assignment of a particular PHY block and a link layer block to a port allows each of ports 908-914 to operate independently of other ports. For high speed operation, ports 908-914 may be linked together to act as one port with multiple lanes. A multiple lane port circuit design produces a memory with a high speed (e.g., 10 Gigabit or higher) interface for a given channel. By bit aligning ports 908-914, conventional serial buffer memories (e.g., FIFO) may be eliminated, thus reducing die sizes and simplifying circuit designs, while still achieving high data transfer rates.

In some embodiments, serial memory interface 900 may be implemented using differential pairs of transmitters and receivers. For example, pairs of differential transmitters and differential receivers may be implemented using an analog design to achieve the signaling speed requirements of Giga hertz (GHz) or higher frequency signals. An example of a differential pair of transmitters and receivers that may be implemented in each of PHY blocks 920-926 is described below in connection with FIG. 10.

Figure 10:
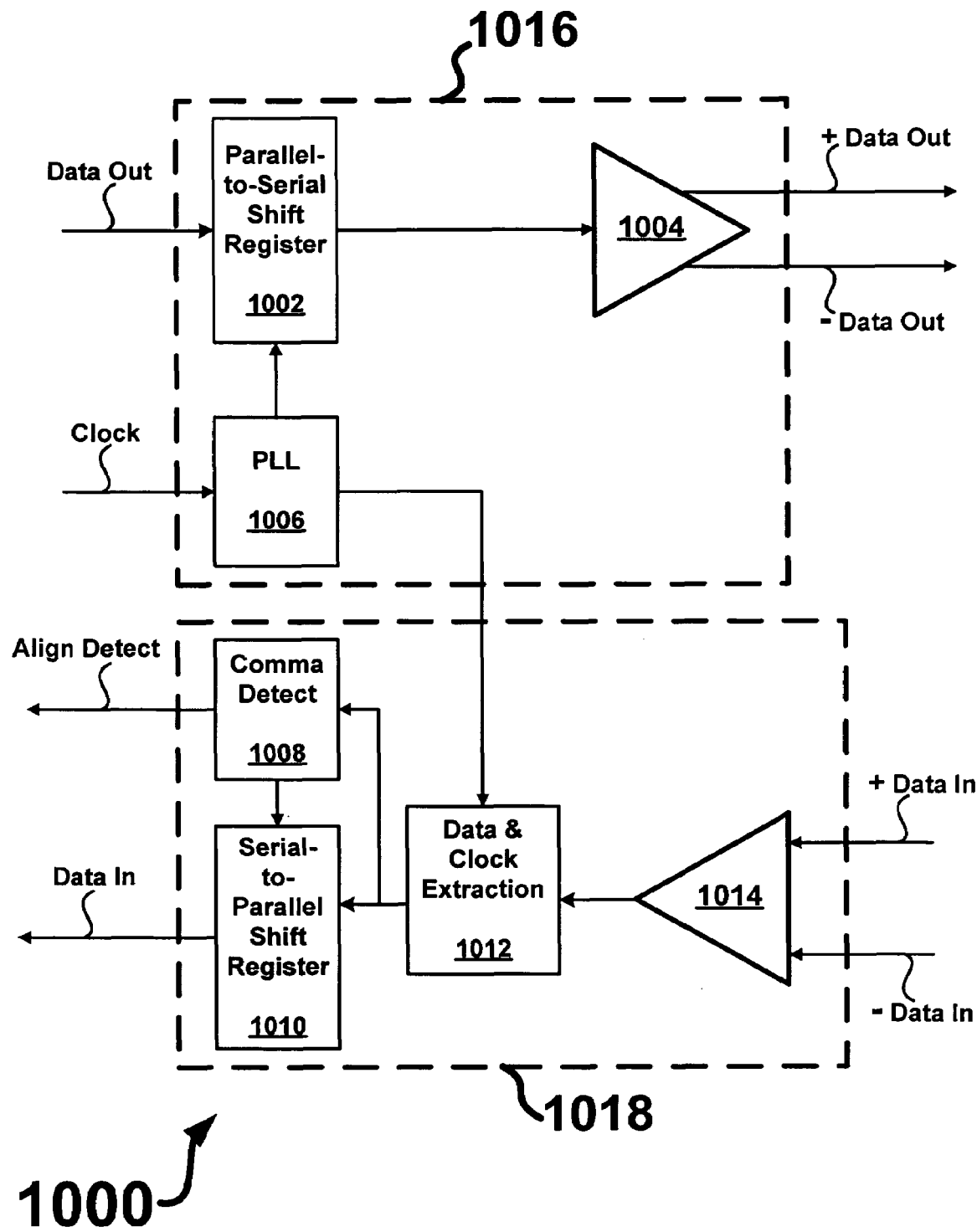
FIG. 10 illustrates an exemplary physical layer logic block including a differential transmitter and differential receiver.

FIG. 10 illustrates an exemplary physical layer logic block 1000 including a differential transmitter 1016 and a differential receiver 1018. In some embodiments, physical layer logic block 1000 includes parallel-to-serial shift register 1002, data-out gate 1004, phase locked loops (PLL) 1006, comma detect logic block 1008, serial-to-parallel shift register 1010, data and clock extraction block 1012, and data-in gate 1014. Here, differential transmitter 1016 and differential receiver 1018 may be implemented to perform differential signaling to enable data access across a serial memory interface. Techniques for differential signaling are described below.

Parallel-to-serial shift register 1002, data-out gate 1004, and PLL 1006 may be implemented as a differential transmitter 1016 while comma detect logic block 1008, serial-to-parallel shift register 1010, data and clock extraction block 1012, and data-in gate 1014 may be implemented as a differential receiver 1018. The data output (i.e., +Data Out and −Data Out) of the differential transmitter 1016 is forwarded to external devices requesting data from a memory plane (not shown). Data input (i.e., +Data In and −Data In) to the differential receiver 1018 is sent to a memory partition for performing read or write operations. Here, physical layer logic block 1000 may be implemented in PHY blocks 920-926 (FIG. 9) using the differential transmitter 1016 and the differential receiver 1018 circuits described above. Physical layer logic block 1000 may be implemented with serial memory interface 900 (FIG. 9) using PLL 1006 for data insertion and extraction.

In some embodiments, PHY blocks 920-926 may include PLL 1006 for locking (i.e., synchronizing) with a system (e.g., CPU) clock. If multiple ports are implemented, PLL 1006 may be shared by the multiple ports. Parallel-to-serial shift register 1002 is a high speed register configured to convert parallel data sent from a memory plane to controller 902 (FIG. 9). Parallel data may be the width of the encoded data width being sent. For example, an encoded data width may be 10 bits for 8B/10 B encoding methods. However, different data widths and encoding methods may be used.

For example, speeds of serial data encoding may range from 3 Gb/s to 10 Gb/s. Parallel-to-serial shift register 1002 may use wider data widths to alleviate clock timing to support higher speeds. For example, widths of 20, 40, and 80 bits may be implemented. Parallel-to-serial shift register 1002 generates a serial bit stream at the clock rate of serial memory interface 900 (FIG. 9), which is received from PLL 1006.

Figure 11:
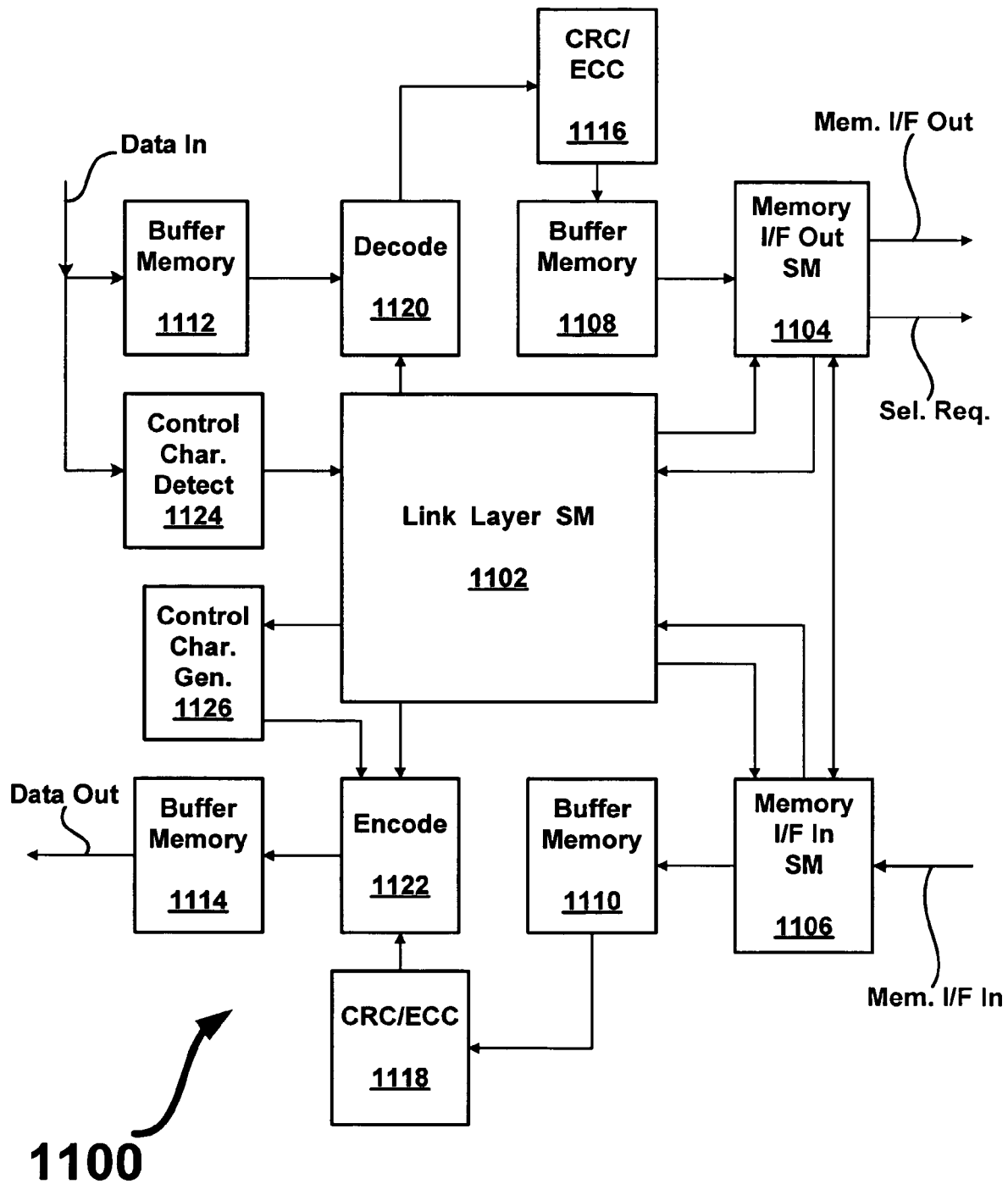
FIG. 11 illustrates an exemplary link layer logic block.

The output of data-in gate 1014 is input to data and clock extraction block 1012, which extracts clock data and requested payload data. Output signals from data and clock extraction block 1012 are input to serial-to-parallel shift register 1010, which is a high speed shift register for converting high speed serial inputs to a parallel format to enable data handling at a slower system clock speed. Parallel data from serial-to-parallel shift register 1010 may be 10 bits wide. However, different widths may be implemented. Comma detect logic block 1008 detects a special control character used for bit alignment. For example, in 8B/10B encoding, a special character may be a unique data pattern (e.g., K28.5 character, as described below). When a special character is detected, serial-to-parallel shift register 1010 is reset to a desired bit setting to allow incoming data to be aligned, which enables data to be received at desired byte and word boundaries, depending on the decoding length of the decode/encode hardware. Regardless of the decode length, a bit stream may be partitioned at a location to ensure that data bits are aligned according to byte and word boundaries.

FIG. 11 illustrates an example of an exemplary link layer logic block 1100. In some embodiments, link layer logic circuit 1100 includes link layer state machine 1102, memory interface block (Out) 1104, memory interface block (In) 1106, buffer memories 1108-1114, CRC/ECC blocks 1116 and 1118, decoder 1120, encoder 1122, control character detector 1124, and control character generator 1126. Link layer logic circuit 1100 implements overall logic for a serial memory interface. Link layer logic circuit 1100 also implements handshake signaling between various interface blocks and is responsible for frame control and cyclic redundancy checks (CRC) and generation. Link layer logic circuit 1100 controls data flow, grants access to requested memory planes, and handles handshake protocols with memory planes based on decoded commands (e.g., read or write operations). Link layer logic circuit 1100 may be described in terms of a "write path" and a "read path."

In some embodiments, a "write path" may be implemented using various blocks of link layer logic circuit 1100 to write data to a memory partition (not shown). Here, data is sent from PHY blocks 920-926 (FIG. 9), which is received into buffer memory 1112. Buffer memories 1108-1114 may be implemented using various techniques (e.g., FIFO). After the data is received at buffer memory 1112, the data is passed to decoder 1120, which decodes data in order to determine how the packet should be handled, interpreted, routed, and the like. Control character detector 1124 evaluates the received data to determine whether any control characters are present. If control characters are detected, then the data is passed to link layer state machine 1102 to activate handshake sequences with a PHY block (FIG. 9) of a serial memory interface. Once a start bit or bits has been detected, buffer memory 1112 is allowed to start gathering data from the sending PHY block. Data pulled into buffer memory 1112 is passed through decoder 1120 converting encoded data into normal (i.e., readable, writeable) data. The data is passed to CRC/ECC block 1116 to correct data errors prior to sending the data to buffer memory 1108. After performing CRC or ECC checks, data is sent to buffer memory 1108, which transfers the data, via memory interface block (Out) 1104, to a memory partition. Link layer state machine 1102, after observing start header data bits, activates memory interface block (Out) 1104, which sends a request or "bid" for access to a memory partition indicated by the incoming packet data. Memory interface block (Out) 1104 waits for confirmation of selection. After receiving confirmation, memory interface block (Out) 1104 starts a write sequence with the selected memory partition by sending an address (i.e., for a memory cell or cells within the selected memory partition), data, and control data to write to the address in the selected memory partition. As data is being written, link layer state machine 1102 also sends control characters over a read data path to control the flow of data into buffer memory 1112.

Data flow is controlled by monitoring information such as incoming control characters as well as the availability of buffer memory 1112. Based on this information, link layer state machine 1102 sends control characters selected from control character generator 1126 back to controller 902 (FIG. 9). Control characters selected from control character generator 1126 are passed through encoder 1122. A handshake is performed between buffer memory 1114 and the sending PHY block, which enables the selected control characters to be sent back to the transmitting PHY block. When an end primitive is sent to encoder 1122, CRC/ECC block 1118 performs a check before sending data back to the transmitting PHY block. If an error is detected, the write operation is aborted and an error signal is sent back to the sending device (i.e., transmitting PHY block). If the data received for the write operation is correct, the request is removed and the priority selection is dropped between the port and the selected partition and a success status primitive is sent.

Memory interface block (Out) 1104 loads the starting address and updates the address counter on each transfer. When an address counter in memory interface block (Out) 1104 reaches the last address for the selected memory plane or sub-plane, the write operation is halted and the memory plane or sub-plane is deselected. Also, if a last address is sent and a write operation is performed, a halt and deselect of the memory partition is performed, even if buffer memory 1112 still includes data or an end primitive that has not been received. If buffer memory 1112 still has data or an end primitive that has not been sent by the transmitting PHY block, memory interface block (Out) 1104 increments the partition address and sends a bid requesting priority for the memory partition. Once access is granted the write operation continues. Additionally, sequential accesses that cross memory boundaries are handled without dividing large data block writes into smaller block writes.

In some embodiments, link layer logic circuit 1100 may be configured to "write protect" memory planes or sub-planes within a memory array, to prevent data from being overwritten. Write protection may be implemented by selecting polarity on write protect pins or writing to an internal control register (e.g., write protect register; not shown) with data bits included in the register to indicate that particular memory cells or addresses are write protected. An entry may be made into a write protect register using non-volatile memory, which enables write protection for a memory cell, regardless of whether power is supplied. Further, writing data to internal registers such as write protect registers may be implemented in a serial memory interface using special control characters.

"Read paths," in some embodiments, may be implemented from a memory array by sending start primitives from controller 902 (FIG. 9) over a "write path" (as described above). Included with the start primitives may be an address and data transfer count. Data for a read operation may be transferred along the same path as that described above for a write operation. When a read command is detected, a memory partition is selected and handshaking begins between link layer state machine 1102 and the selected memory partition. Data received from the memory partition is received in buffer memory 1110 and a CRC/ECC check is performed by CRC/ECC block 1118. The data stream is encoded and encapsulated in packets by encoder 1122 and link layer state machine 1102. After encoding and encapsulation, the data is sent to the receiving PHY interface and the device requesting the data read from the memory partition. Data packets used to send "read" data include a start primitive and an end primitive with data bits used to perform a CRC/ECC check. During the read operation, memory interface block (In) 1106 increments an address counter and decrements a data counter, until an end address of a memory plane or sub-plane is reached. When an end address is reached, link layer state machine 1102 deselects the memory partition, increments the address counter and selects a new partition to continue fetching data for a read operation. By reading data using the above system, large blocks of data do not need to be divided into smaller blocks, reducing system resource demand and decreasing the cost of controller 902 (FIG. 9).

Figure 12:
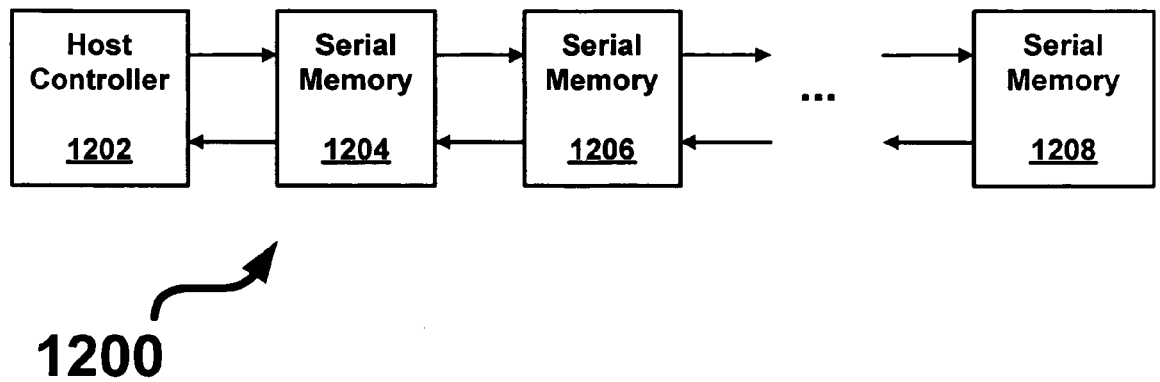
FIG. 12 illustrates an exemplary memory system configuration.

FIG. 12 illustrates an exemplary memory system 1200. In some embodiments, memory system 1200 includes host controller 1202 and serial memories 1204-1208. In this embodiment, three memories arrays are shown connected in serial in a "cascading" configuration. By cascading serial memory devices or arrays, capacity is increased without decreasing serial access speeds. Although three (3) memory arrays (e.g., serial memories 1204-1208) are shown, any number of memory arrays may be connected and are not limited to those shown. Here, memory system 1200 may be implemented using a "cascading" technique to connect memory arrays in series. This technique enables serial memories 1204-1208 to be logically connected in series to minimize interconnections and load changes to host controller 1202. In other embodiments, serial memories 1204-1208 may be physically configured differently on a die, to enable vertical, horizontal, orthogonal, asymmetric, or other configurations.

In some embodiments, host controller 1202 connects to serial memory 1204, which tests address boundaries and resynchronizes signals for transmitting a request for a read or write operation over an outgoing port to serial memories 1206-1208. A back-channel (receive) path returns the data, which is priority selected with the memory data, passing the information from the path that wins priority. Each of serial memories 1204-1208 performs the same function, allowing a fast serial cascading of interface signals from host controller 1202.

Figure 13:
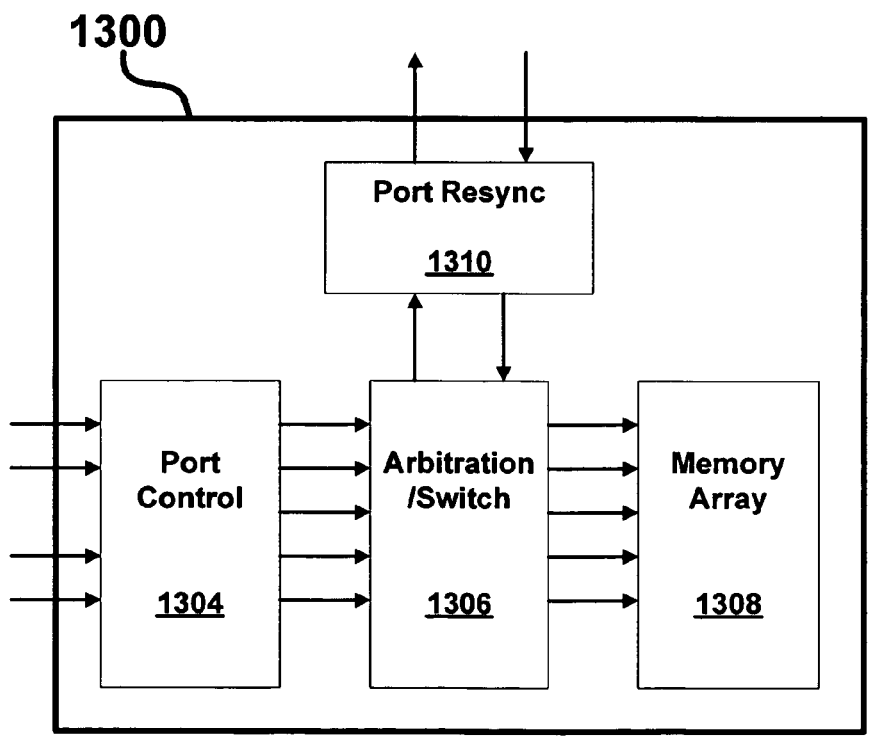
FIG. 13 illustrates an exemplary serial memory interface implementation.

FIG. 13 illustrates an exemplary serial memory interface implementation. In some embodiment, serial memory interface 1300 includes port control block 1304, arbitration switch 1306, memory array 1308, and port resynchronization block 1310. Serial memory interface 1300 may be used to implement the "cascading" feature described above in connection with FIG. 12. Referring back to FIG. 13, incoming requests from a host are sent to port control block 1304, which passes the request to arbitration switch 1306. Logic in arbitration switch 1306 determines which incoming and outgoing ports are used with a selected memory partition. After selecting a cascading port, incoming data packets are passed to an outgoing serial control line. Data being returned as incoming data from the cascading input control lines are sent to the host. In other embodiments, more than one cascading port may be implemented, allowing for a high-speed, switched or a single port expansion memory system.

Figure 14:
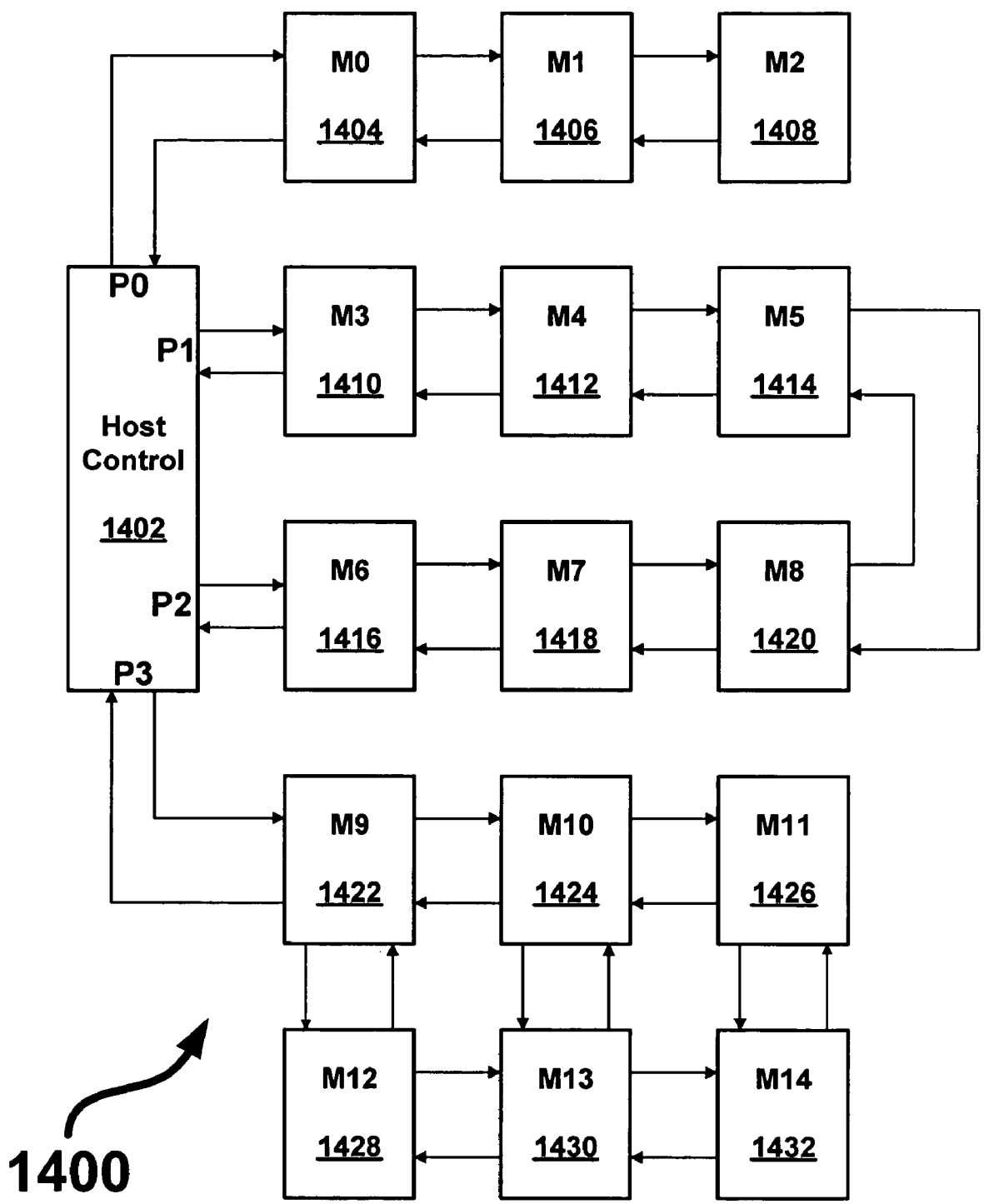
FIG. 14 illustrates an exemplary switched memory structure.

FIG. 14 illustrates an exemplary switched memory structure 1400. In some embodiments, switched memory structure 1400 includes host controller 1402 and memory array (M0) 1404, memory array (M1) 1404, memory array (M2) 1408, memory array (M3) 1410, memory array (M5) 1412, memory array (M5) 1414, memory array (M6) 1416, memory array (M7) 1418, memory array (M8) 1420, memory array (M9) 1422, memory array (M10) 1424, memory array (M11) 1426, memory array (M12) 1428, memory array (M13) 1430, and memory array (M14) 1432. Here, three different types of port-to-memory array connections are shown. It should be appreciated that although three different connection types are depicted, some embodiments may utilize only a single connection type. First, port P0 on host controller 1402 is connected to cascading, serially-connected memory arrays (M0) 1404, (M1) 1406, and (M2) 1408. The connections with port P0 may be implemented using 1 to n lanes of interface lines. For example, a high speed implementation may use 4 or 8 lanes of interface lines acting in parallel. Second, port P1 connects to memory array (M3) 1410, memory array (M4) 1412, memory array (M5) 1414, memory array (M6) 1416, memory array (M7) 1418, and memory array (M8) 1420 using a similar technique as port P0. Here, port P1 and P2 share access to memory arrays 1410-1420. This configuration enables system path redundancy, providing an alternate channel to access memory arrays 1410-1420, if either port P1 or port P2 becomes unavailable. In some embodiments, performance may be improved by restricting port P1 to accessing memory arrays 1410-1414 and port P2 to accessing memory arrays 1416-1420. In this embodiment, the alternate path may be used if either port P1 or port P2 becomes unavailable, providing a cross-interface between the two sets of memory arrays. Third, port P3 is connected to memory array (M9) 1422, memory array (M10) 1424, memory array (M11) 1426, memory array (M12) 1428, memory array (M13) 1430, and memory array (M14) 1432 in a "grid" that allows multiple paths for accessing memory partitions with the arrays. The grid may be implemented using an arbitrary number of arrays to enable smaller or larger "hyper arrays" to be used. The "grid" allows for complex, switched accesses to memory partitions within the arrays. Transferring data packets using decision-making protocols and buffer memories such as those described above, switched memory structure 1400 allows for commands to be stacked enabling multiple accesses to be sent on one channel using automatic fetching. In some embodiments, switched memory structure 1400 may grant priority to particular requests based on a desired memory partition. For example, some memory addresses may be important to an operating system or system performance, enabling higher priority to be granted. Other port-to-memory array connection configurations may be implemented and are not limited to those described above.

FIG. 15 illustrates an example of an exemplary data packet structure used with a serial memory interface. Here, data packet structure 1500 includes IDLE primitive 1502, END primitive 1504, CRC/ECC primitive 1506, data payload 1508, address 1510, address marker 1512, and "start of frame" primitive 1514. Interpreted from right to left (i.e., as data packet structure 1500 is transmitted or received), the various headers and primitives provide data that enables handling of data packet structure 1500 when accessing a memory partition. Data packet structure 1500 includes address information (e.g., address 1510, address marker 1512 (which indicates that the data bits are the address of the desired memory cell)). In some embodiments, the most significant (i.e., high order or left-most) bit (MSB), indicates the RD/WR information and address bits that are used by host controller (902, FIG. 9; 1202, FIG. 12) when selecting a memory partition.

Serial memory interface uses a packet protocol to interpret and handle data traffic. In some embodiments, an "align" primitive is used to allow a serial memory interface to maintain bit synchronization. This primitive may be varied, depending upon the data encoding scheme in use. For example, in 8B/10B encoding, the "align" primitive is the K28.5 character, which may be sent periodically to ensure bit synchronization is maintained. This primitive is sent on a control line and is not used or entered into buffer memories. As another example, "start of frame" primitive 1514 may be used to indicate that an incoming packet is being received. Still another control primitive is address marker 1512, which presages a destination address for data payload 1508. Special control primitives may also be used to indicate the end of packet (e.g., END primitive 1504). Special control primitives may also be used to indicate a special internal function destination for data packet structure 1500, such as a configuration register.

FIG. 16 illustrates an example of an exemplary data packet 1600 used with a serial memory interface after a command initial data packet is sent. Here, data packet 1600 includes IDLE primitive 1602, END primitive 1604, CRC/ECC primitive 1606, data payload 1608, and "start of frame" primitive 1610. Interpreted from right to left, data packet 1600 may be used after a command and initial data packet have been sent (e.g., data packet 1500).

FIG. 17 illustrates an example of an exemplary data packet structure 1700 used to implement a special internal write of a register. In some embodiments data packet structure 1700 may include IDLE primitive 1702, END primitive 1704, CRC/ECC primitive 1706, data payload 1708, address 1710, address marker 1712, special marker 1714, and "start of frame" primitive 1716. If a special internal write of a register or status is desired, data packet structure 1700 may be used. In other embodiments, data fields for the data packet structures may be application dependent. Therefore, actual data packet structures for a specific implementation may include different fields, additional fields, or fewer fields than those depicted in FIGS. 15, 16, and 17.

Although the foregoing embodiments have been described in some detail for purposes of clarity of understanding, implementations of the above-described system and techniques is not limited to the details provided. There are many alternative implementations and the disclosed embodiments are illustrative and not restrictive.

What is claimed:

1. A memory system, comprising:
a partitioned memory army, each partition operable to be accessed independently;
a plurality of serial ports in data communication with the partitioned memory array; and
arbitration switch logic configured to control access to each partition of the partitioned memory array by the plurality of serial ports.

2. The memory system recited in claim 1 wherein the memory array is non-volatile.

3. The memory system recited in claim 1, wherein the partitioned memory array is configured as a stacked cross point array.

4. The memory system recited in claim 1 wherein the partitioned memory array includes two-terminal memory elements that include an electrolytic tunnel barrier and a mixed valence conductive oxide.

5. The memory system recited in claim 1, wherein each partition is a vertical plane.

6. The memory system recited in claim 1, wherein each partition is a sub-plane.

7. The memory system recited in claim 1, wherein each of the plurality of serial ports is configured to operate independently of other serial ports.

8. The memory system recited in claim 1, wherein each of the plurality of serial ports is configured to access multiple partitioned memory arrays.

9. The memory system recited in claim 8, wherein at least two of the plurality of serial ports are configured to cascade with each other.

10. The memory system recited in claim 1, wherein the arbitration switch logic is configured to select one of the partitions of the partitioned memory array using packet data received by the plurality of serial ports.

11. The memory system recited in claim 10, wherein packet data includes a control character configured to identify a data packet characteristic.

12. The memory system recited in claim 1, wherein the arbitration switch logic controls access to each partition of the partitioned memory array by the plurality of serial ports by performing a priority select function.

13. The memory system recited in claim 1 and further comprising an encoder configured to encode data transferred over the plurality of serial ports.

14. The memory system recited in claim 1 and further comprising a physical layer logic module having a phased locked loop circuit that is shared by the plurality of serial ports.

15. The memory system recited in claim 1, wherein one or more of the plurality of serial ports uses differential signaling.

16. The memory system recited in claim 1, wherein the data is transferred according to a protocol used by the plurality of serial ports, the protocol enabling different data packets to be sent between the memory array and the plurality of serial ports.

17. A memory system, comprising:
a non-volatile memory array;
serial ports in data communication with the non-volatile memory array, wherein the serial ports are operable to send an access request to the non-volatile memory array; and
logic to connect the serial ports, where the serial ports can access the internal non-volatile memory or can pass a access requests from one serial port to another serial port,
wherein at least one serial port is operable to be connected to another memory system having a serial port that is in data communication with a non-volatile memory array.

18. The memory system recited in claim 17, wherein at least one serial port is configured to cascade with another memory system having a serial port that is in data communication with a non-volatile memory array.

19. The memory system recited in claim 18, wherein the cascaded ports can be accessed from two directions, whereby redundant paths are configured for an array of devices.

20. The memory system recited in claim 19, wherein access requests are configurable to be routed in either of the two directions.

21. The memory system recited in claim 17, further comprising arbitration logic to arbitrate routing corresponding to address information within the access request.

22. The memory system recited in claim 17, wherein at least two serial ports are operable to be connected to at least two other memory systems, each memory system having a serial port that is in data communication with a non-volatile memory array.

23. The memory system recited in claim 22, wherein at least three serial ports are operable to be connected to at least three other memory systems, each memory system having a serial port that is in data communication with a non-volatile memory array.

24. The memory system recited in claim 17, wherein the memory device operates as a switch between multiple serial ports.

25. The memory device recited in claim 17, wherein the non-volatile memory array stores configuration data that operable to set address assignments and muting permits.

26. The memory device recited in claim 17, wherein separate memory systems may be accessed simultaneously.

* * * * *

UNITED STATES PATENT AND TRADEMARK OFFICE
CERTIFICATE OF CORRECTION

PATENT NO. : 7,522,468 B2
APPLICATION NO. : 11/449105
DATED : April 21, 2009
INVENTOR(S) : Robert Norman Page 1 of 1

It is certified that error appears in the above-identified patent and that said Letters Patent is hereby corrected as shown below:

In Column 13, on Line 25 Claim 1,

Delete "army" and insert --array--.

Signed and Sealed this

Nineteenth Day of May, 2009

JOHN DOLL
*Acting Director of the United States Patent and Trademark Office*